United States Patent
Chiang et al.

(10) Patent No.: US 7,796,455 B2
(45) Date of Patent: Sep. 14, 2010

(54) DEVICE CONTROLLING PHASE CHANGE STORAGE ELEMENT AND METHOD THEREOF

(75) Inventors: Pei-Chia Chiang, Taipei (TW); Shyh-Shyuan Sheu, Taichung (TW); Lieh-Chiu Lin, Kaohsiung (TW); Wen-Pin Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 77 days.

(21) Appl. No.: 12/142,724

(22) Filed: Jun. 19, 2008

(65) Prior Publication Data

US 2009/0080243 A1 Mar. 26, 2009

(30) Foreign Application Priority Data

Sep. 21, 2007 (TW) .............................. 96135340 A (51) Int. Cl.
*G11C 7/02* (2006.01)

(52) U.S. Cl. .................... 365/210.1; 365/163; 365/151; 365/158; 365/148

(58) Field of Classification Search ............. 365/210.1, 365/163, 151, 158
See application file for complete search history.

(56) References Cited

U.S. PATENT DOCUMENTS

| | | | |
|---|---|---|---|
| 6,456,524 B1 * | 9/2002 | Perner et al. ............... 365/158 |
| 6,967,865 B2 * | 11/2005 | Lee ............................ 365/163 |
| 7,116,593 B2 * | 10/2006 | Hanzawa et al. ............ 365/203 |
| 7,224,598 B2 * | 5/2007 | Perner ........................ 365/148 |
| 7,495,971 B2 * | 2/2009 | Egerer ..................... 365/189.09 |
| 7,499,349 B2 * | 3/2009 | Roehr ......................... 365/196 |
| 7,548,448 B2 * | 6/2009 | Philipp et al. ............... 365/158 |
| 2004/0151023 A1 | 8/2004 | Khouri et al. |

* cited by examiner

*Primary Examiner*—Viet Q Nguyen (57) ABSTRACT

Devices controlling a phase change storage element and methods for increasing reliability of a phase change storage element. The invention introduces a first operation mode and a second operation mode. A reference phase change storage element is forced a write current for an ideal conduction period in the first operation mode. In the second operation mode, the invention generates a proper conduction period based on the resistance of the reference phase change storage element, and forces the write current into the controlled phase change storage element for the proper conduction period.

8 Claims, 7 Drawing Sheets

DEVICE CONTROLLING PHASE CHANGE STORAGE ELEMENT AND METHOD THEREOF

CROSS REFERENCE TO RELATED APPLICATIONS

This application claims priority of Taiwan Patent Application No. 96135340, filed on Sep. 21, 2007, the entirety of which is incorporated by reference herein.

BACKGROUND OF THE INVENTION

1. Field of the Invention

The invention relates to devices controlling a phase change storage element and methods thereof, wherein reliability of a phase change storage element is increased.

2. Description of the Related Art

Phase change storage elements are generally used in memory devices, named phase change memories (PCMs). The phase change storage element can switch between a crystalline state and an amorphous state. A write current is forced into the phase change storage element to vary its state. The state of the phase change storage element is dependent on the magnitude and the conduction period of the write current. When the write current has a great magnitude and a short conduction period, the phase change storage element is switched to the amorphous state and has great resistance. This condition is named 'reset mode', and is used in storing data '1'. When the write current has a low magnitude and a long conduction period, the phase change storage element is switched to the crystalline state and has low resistance. This condition is named 'set mode', and is used in storing data '0'.

To achieve large capacity, modern memory devices are usually composed of a plurality of memory banks. On a wafer, the memory banks may spread over a large area. Because of manufacturing process deviations, the different areas of a wafer may have different electronic characteristics, such that the phase change storage elements of different memory banks on a wafer may have different resistances when they are in the set mode.

In this specification, the ideal resistance of a phase change storage element in the set mode is named 'ideal set mode resistance'. In a case where the ideal set mode resistance is 10K ohm, the resistance of a phase change storage element should be 10K ohm after being forced a write current for an ideal conduction period. However, because of manufacturing process deviations, some phase change storage elements may not be completely transformed into the set mode. As a result, the set mode resistance is increased to 15K ohm from 10K ohm, much greater than the ideal set mode resistance. Additionally, in other cases, because of manufacturing process deviations, some phase change storage elements may be too sensitive to the write current. As a result, the set mode resistance is decreased to 8K ohm from 10K ohm, much lower than the ideal set mode resistance.

Thus, novel techniques capable of equalizing the resistance of all phase change storage elements of all memory banks are called for.

BRIEF SUMMARY OF THE INVENTION

The invention provides devices controlling a phase change storage element, which comprises a current source, a reference phase change storage element, a reference resistor, a conduction period controller, and a switch circuit. The current source provides a write current. The reference phase change storage element is produced by a manufacturing process similar to that which produces the controlled phase change storage element. The resistance of the reference resistor equals to the ideal set mode resistance of the reference phase change storage element. The conduction period controller comprises a first switch for coupling to a resistor. The conduction period controller controls the conduction period of the write current to be proportional to the resistor to which the first switch is coupled. The switch circuit is switched to force the write current into the reference phase change storage element or the controlled phase change storage element. In a first operation mode, the resistor coupled to the first switch is the reference resistor, and the switch circuit is switched to force the write current into the reference phase change storage element. In a second operation mode, the resistor coupled to the first switch is the reference phase change storage element, and the switch circuit is switched to force the write current into the controlled phase change storage element. The conduction period controller controls the conduction period to equal to the ideal conduction period of the reference phase change storage element in the first operation mode.

The invention further discloses methods increasing the reliability of a phase change storage element. The method provides a reference phase change storage element, a reference resistor and a conduction period controller. The reference phase change storage element is produced by a manufacturing process similar to that which produces the phase change storage element. The resistance of the reference resistor equals to an ideal set mode resistance of the reference phase change storage element. The conduction period controller comprises a switch for coupling to a resistor, and controls the conduction period of a write current to be proportional to the resistor to which the first switch is coupled. When the resistor coupled to the first switch is the reference resistor, the conduction period controller controls the conduction period to equal to an ideal conduction period of the reference phase change storage element. The method introduces a first operation mode and a second operation mode. In the first operation mode, the method transforms the reference phase change storage element into the set mode by coupling the reference resistor to the first switch as the coupled resistor and forcing the write current into the reference phase change storage element. In the second operation mode, the method transforms the phase change storage element into the set mode by coupling the reference phase change storage element to the first switch as the coupled resistor and forcing the write current into the phase change storage element.

The above and other advantages will become more apparent with reference to the following description taken in conjunction with the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description shows some embodiments carrying out the invention. This description is made for the purpose of illustrating the general principles of the invention and should not be taken in a limiting sense. The scope of the invention is best determined by reference to the appended claims.

Figure 1:
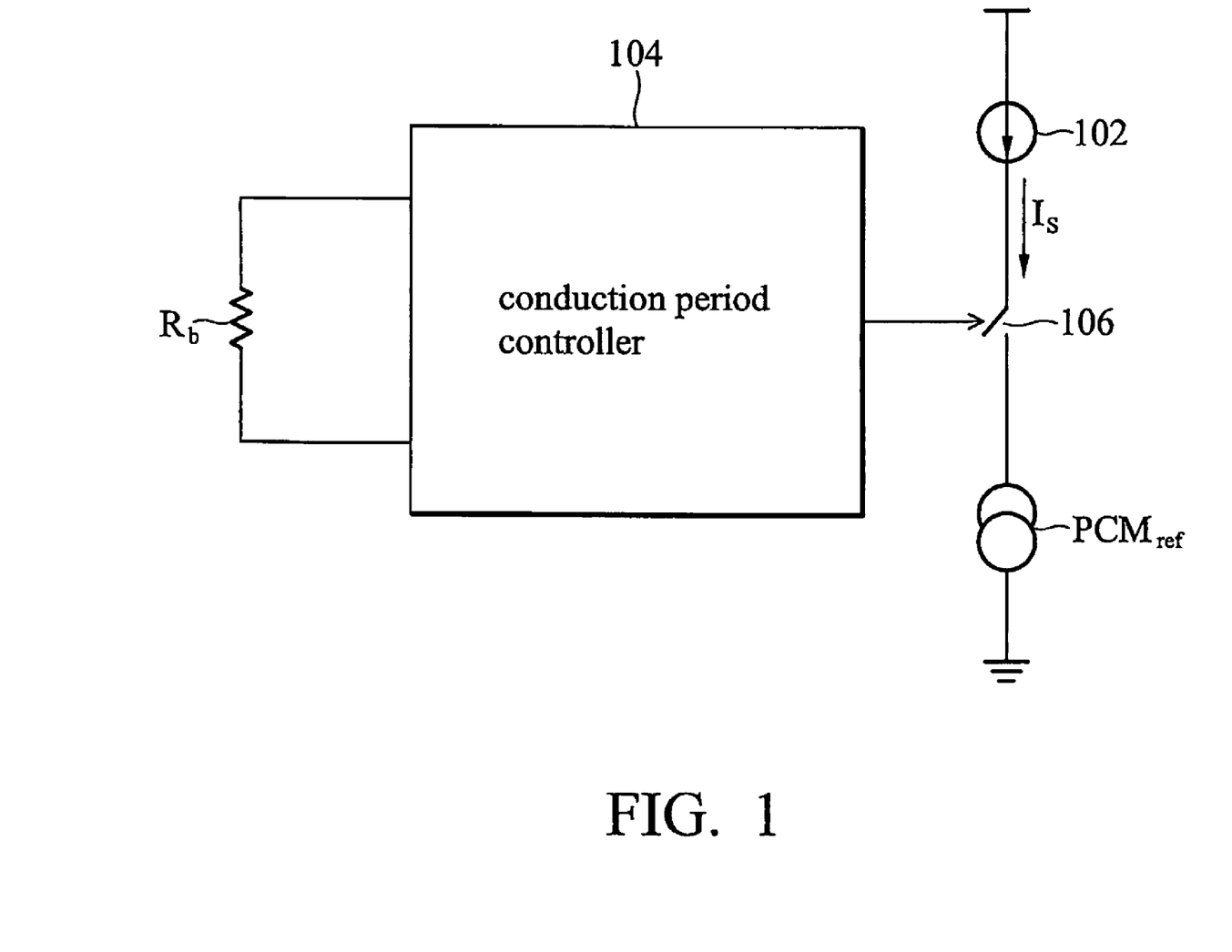
FIG. 1 illustrates an embodiment of the controlling device in the first operation mode.
Figure 2:
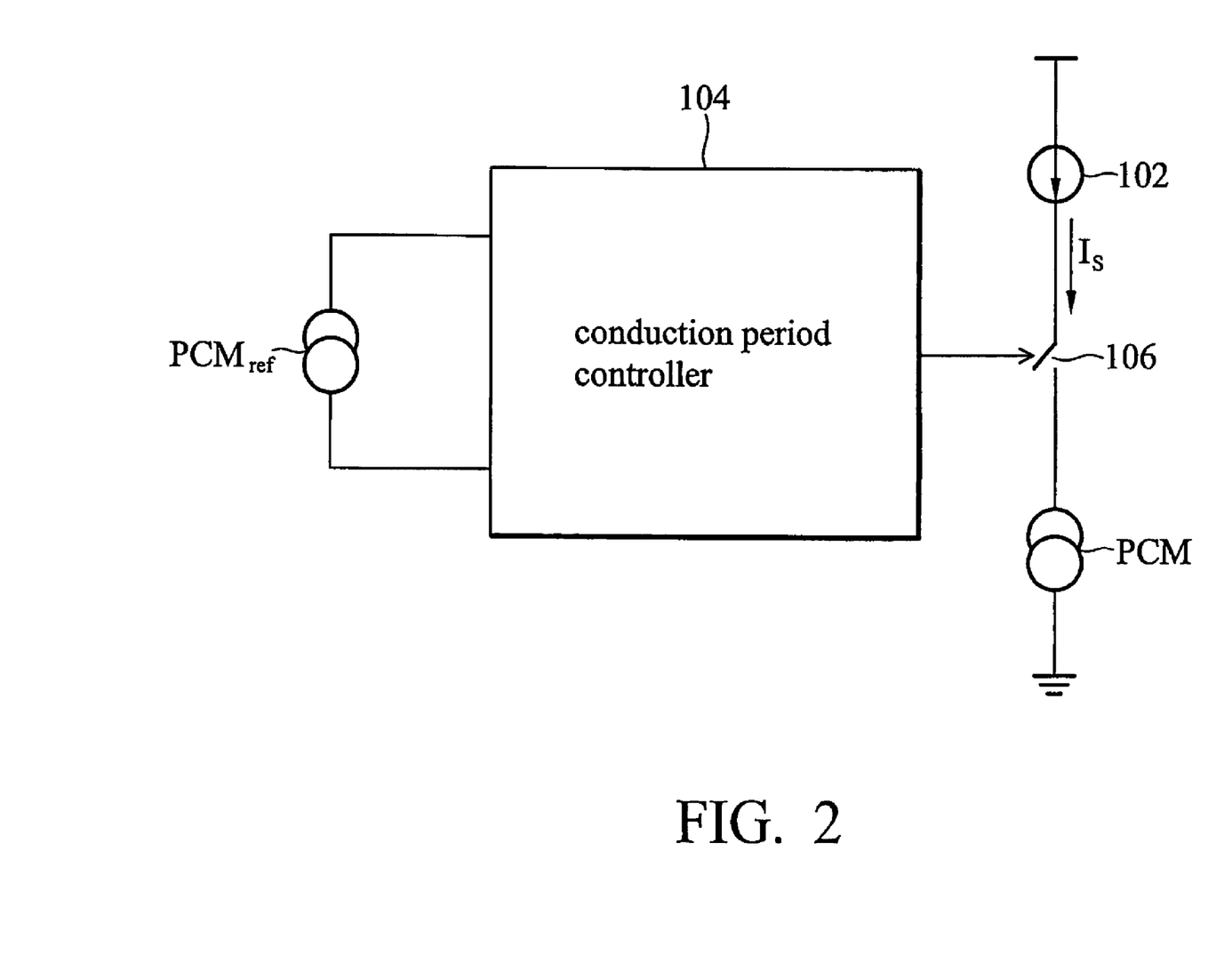
FIG. 2 illustrates an embodiment of the controlling device in the second operation mode.

The invention provides devices controlling a phase change storage element. The controlling device can be operated in a first operation mode and a second operation mode. FIGS. 1 and 2 illustrate the device operated in the first and second operation modes, respectively. As shown in FIGS. 1 and 2, the controlling device comprises a current source 102, a reference phase change storage element $PCM_{ref}$, a reference resistor $R_b$, a conduction period controller 104 and a switch circuit (not shown). The current source 102 provides a write current $I_S$.

The reference phase change storage element $PCM_{ref}$ may be produced by a manufacturing process similar to that which produced the controlled phase change storage element. Thus, the phase transitions of both are similar. The reference resistor $R_b$ is designed to have a resistance equal to an ideal set mode resistance of the reference phase change storage element $PCM_{ref}$. The conduction period controller 104 is used to control the conduction period of a write current $I_S$ (in this embodiment, for controlling the conduction period of a switch 106), and comprises a first switch (not shown in FIGS. 1 and 2) coupled to the reference resistor $R_b$ or the reference phase change storage element $PCM_{ref}$. According to the resistance of the resistor to which the first switch is coupled, the conduction period controller 104 varies the length of the conduction period. The greater the resistance is, the longer the conduction period is.

In the first operation mode, the switch circuit (not shown) is switched to force the write current $I_S$ into the reference phase change storage element $PCM_{ref}$ while the first switch is coupled to the reference resistor $R_b$ (referring to FIG. 1, the conduction period controller 104 is coupled to $R_b$). The conduction period controller 104 controls the conduction period to equal to the ideal conduction period of the $PCM_{ref}$. In an ideal case, the resistance of the reference phase change storage element $PCM_{ref}$ should equal to the ideal set mode resistance after being forced the write current $I_S$ for an ideal conduction period. However, because of manufacturing process deviations, the actual resistance of the reference phase change storage element $PCM_{ref}$ deviates from the ideal set mode resistance.

After the first operation mode, the device of the invention switches to the second operation mode. The switch circuit is switched to force the write current $I_S$ into the controlled phase change storage element PCM, and the first switch is coupled to the reference phase change storage element $PCM_{ref}$ (referring to FIG. 2, the conduction period controller 104 is coupled to $PCM_{ref}$). The deviated set mode resistance of the reference phase change storage element $PCM_{ref}$ directs the conduction period controller 104 to modify the conduction period of the write current $I_S$ to satisfy the electronic characteristics of the controlled phase change storage element PCM. Thus, a proper conduction period for setting the controlled phase change storage element PCM to the ideal set mode resistance is determined by the conduction period controller 104. The invention eliminates phase change storage element resistance deviations caused by manufacturing process deviations.

Figure 3:
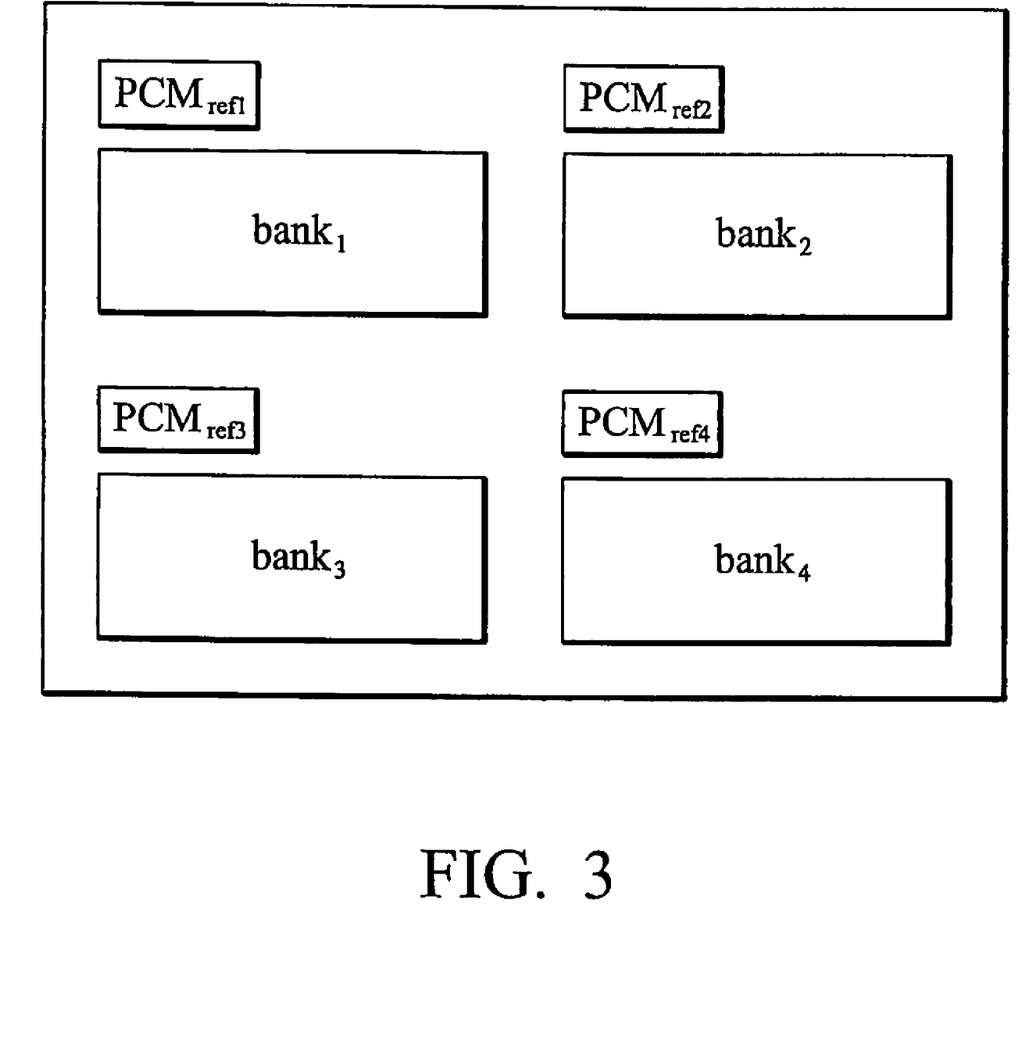
FIG. 3 illustrates an embodiment of the phase change memory of the invention.

The invention further discloses phase change memories. FIG. 3 illustrates an embodiment of the phase change memory, which comprises four memory banks $bank_1$~$bank_4$. The memory banks use phase change storage elements to store data. Because of manufacturing process deviations between different memory banks $bank_1$~$bank_4$, the phase change storage elements of different banks $bank_1$~$bank_4$ have different set mode resistances. To control the phase change storage elements of different banks to have an equivalent set mode resistance, the invention provides the memory banks $bank_1$~$bank_4$ with the reference phase change storage elements $PCM_{ref1}$~$PCM_{ref4}$, respectively. In the embodiment of FIG. 3, the layouts of the reference phase change storage elements $PCM_{ref1}$~$PCM_{ref4}$ are designed next to their corresponding memory banks $bank_1$~$bank_4$ since in a wafer, the electronic characteristics of nearby areas will be similar. With the techniques of the aforementioned controlling devices, the phase change storage elements of different memory banks $bank_1$~$bank_4$ would have identical resistances.

Figure 4:
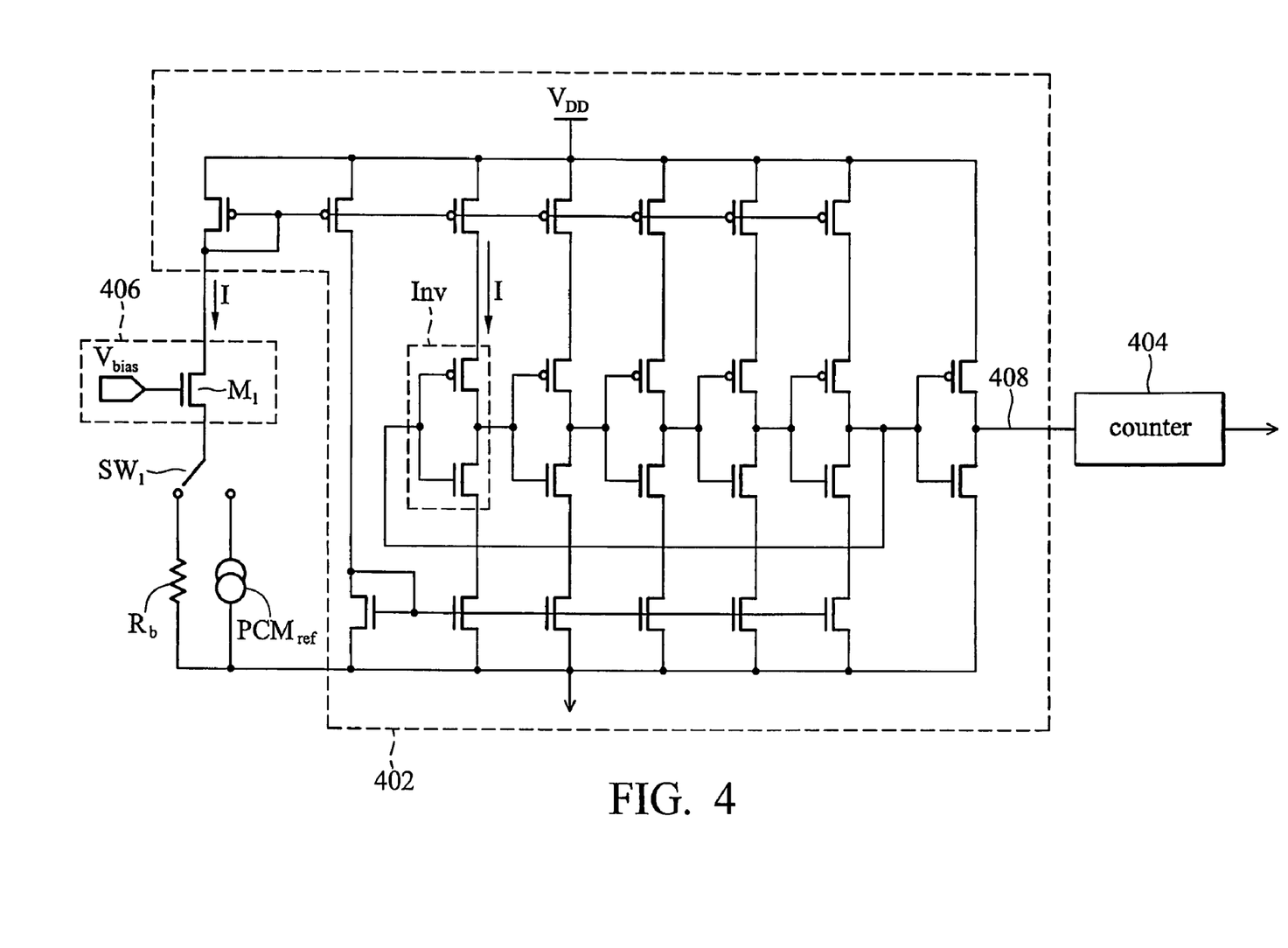
FIG. 4 illustrates an embodiment of the conduction period controller.

FIG. 4 illustrates an embodiment of the conduction period controller of the invention. In additional to the aforementioned first switch $SW_1$, the conduction period controller further comprises an oscillator 402, a counter 404, and a driving current generator 406. The oscillator 402 is composed of a plurality of inverters Inv that are coupled in series. Each of the inverters Inv is driven by a driving current I generated by the driving current generator 406. The signal at the output terminal of the oscillator 402 is an oscillating signal 408. The oscillation period of the oscillating signal 408 is dependent on the driving current I. The greater the driving current I is, the faster the inverters Inv transmit signals and the faster the oscillating signal 408 oscillates. The counter 404 counts the oscillations of the oscillating signal 408 to set the conduction period of the current source $I_s$. The faster the oscillating signal 408 oscillates, the shorter the conduction period is. Referring to FIG. 4, the driving current I is dependent on the resistor to which the first switch $SW_1$ is coupled (the reference phase change storage element $PCM_{ref}$ or the reference resistor $R_b$). The greater the coupled resistance is, the lower the driving current I is.

In FIG. 4, the driving current generator 406 comprises a transistor $M_1$ and a bias source $V_{bias}$. The transistor $M_1$ is coupled in series with the $R_b$ or $PCM_{ref}$ by switching the first switch $SW_1$. The bias source $V_{bias}$ is coupled to the gate of the transistor $M_1$ and provides the $R_b$ or $PCM_{ref}$ with a voltage drop. The current through the coupled resistor ($R_b$ or $PCM_{ref}$) is the driving current I. The greater the coupled resistance is, the lower the driving current I is.

Figure 5:
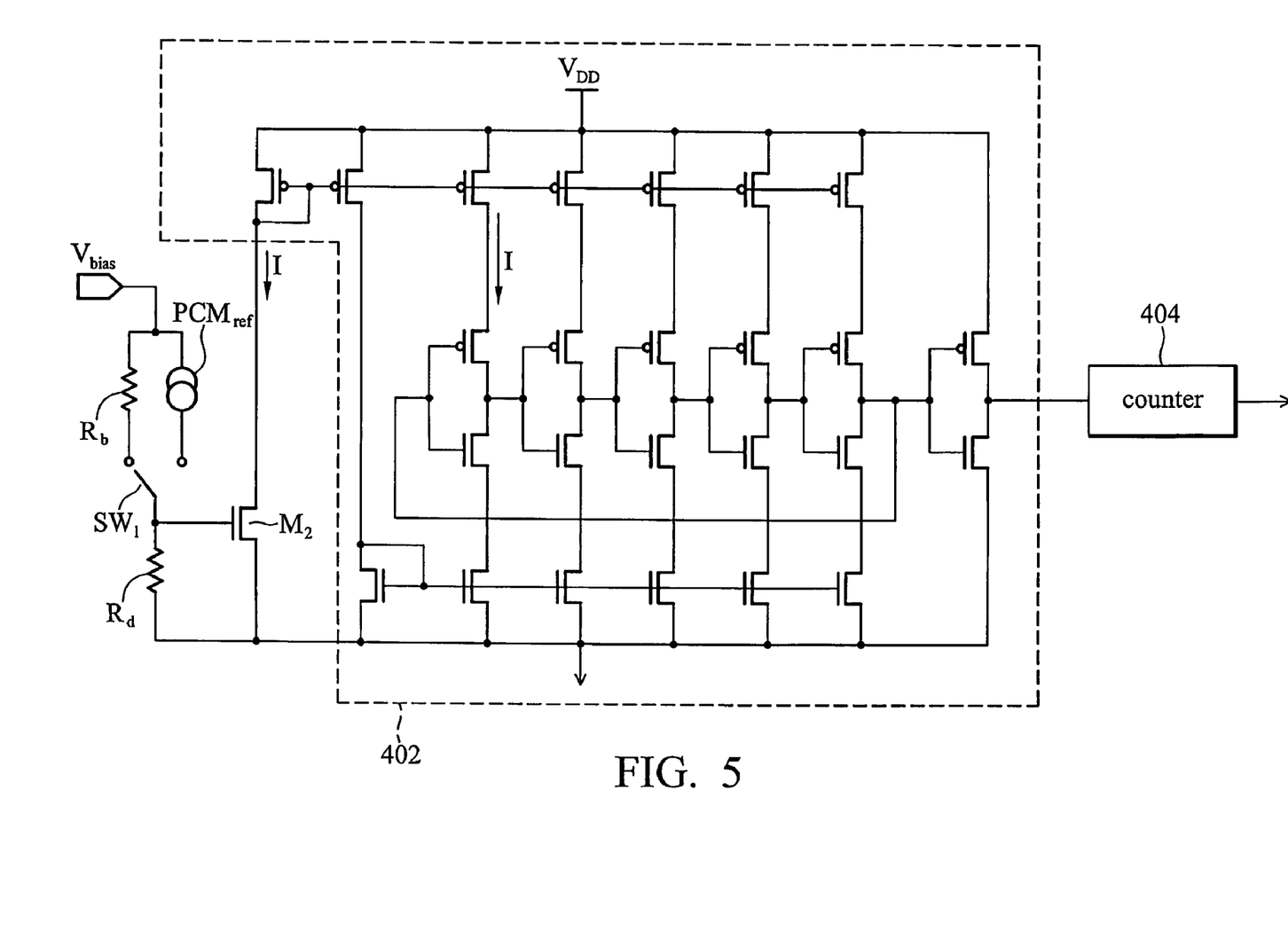
FIG. 5 illustrates another embodiment of the conduction period controller.

FIG. 5 illustrates another embodiment of the conduction period controller, in which the driving current generator comprises a resistor $R_d$ for voltage division, a bias source $V_{bias}$ and a transistor $M_2$. By switching the first switch $SW_1$, the resistor $R_d$ is coupled in series with the $R_b$ or $PCM_{ref}$. $V_{bias}$ provides a constant voltage drop between $R_d$ and the coupled resistor ($R_b$ or $PCM_{ref}$). $R_d$ and the coupled resistor ($R_b$ or $PCM_{ref}$) divides $V_{bias}$ and the divided $V_{bias}$ enables the transistor $M_2$ to generate the driving current I. The greater the coupled resistor ($R_b$ or $PCM_{ref}$) is, the lower the driving current I is.

Figure 6:
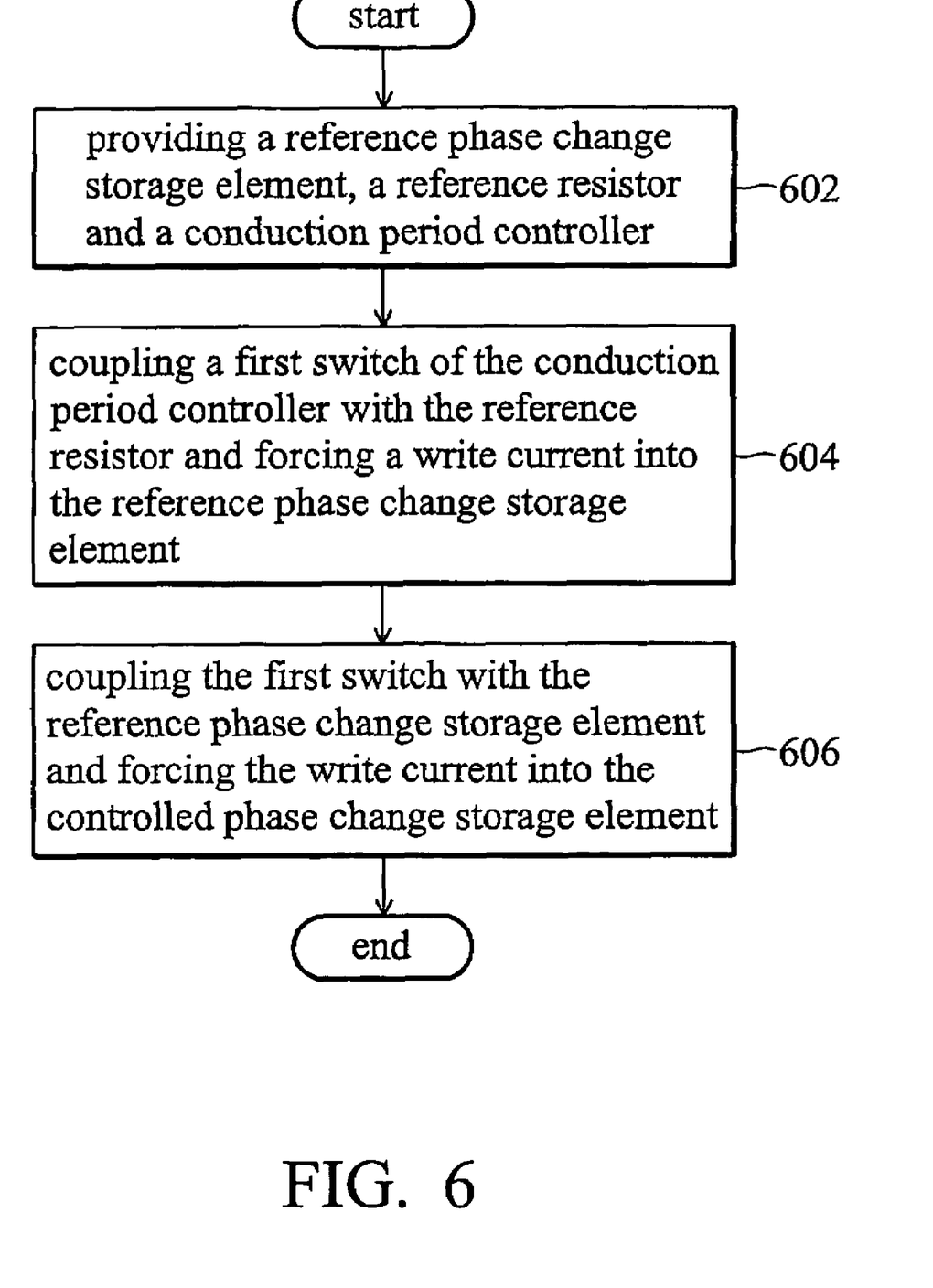
FIG. 6 is a flowchart showing an embodiment of the method of the invention.

The invention further discloses methods for increasing the reliability of a phase change storage element. FIG. 6 is a flowchart, illustrating an embodiment of the method. In step 602, a reference phase change storage element, a reference resistor and a conduction period controller is provided. The electronic characteristics of the reference phase change storage element are similar to that of the phase change storage element, and they may be made by a similar manufacturing process. The resistance of the reference resistor equals to an ideal set mode resistance of the reference phase change storage element. The conduction period controller comprises a first switch for coupling to a resistor (the reference resistor or the reference phase change storage element). The conduction period controller sets the conduction period of a write current to be proportional to the resistor to which the first switch is coupled. The conduction period controller is further designed to make the conduction period equal to an ideal conduction period of the reference phase change storage element when the first switch is coupled to the reference resistor. In step 604, the first switch is coupled to the reference resistor, and the write current is forced into the reference phase change storage element. After forcing the write current into the reference phase change storage element for its ideal conduction period, the reference phase change storage element is transformed into the set mode. However, the final resistance of the reference phase change storage element may deviate from its ideal set mode resistance because of manufacturing process deviations. Specifically, the controlled phase change storage element cannot be set to the ideal set mode resistance by the ideal conduction period, too. The conduction period controller determines a proper conduction period for the controlled phase change storage element by step 606. In step 606, the first switch is switched to couple the reference phase storage element and the write current is forced into the controlled phase change storage element. Thus, the conduction period is dependent on the resistance of the reference phase change storage element. The resistance of the phase change storage element is dependent on its transformation difficulty (transform from reset mode to set mode). The more difficult the transformation is, the greater resistance the reference phase change storage element has and so the longer the conduction period generated by the conduction period controller is. The method eliminates phase change storage elements resistance variations and dramatically increases the reliability of phase change storage elements.

Figure 7:
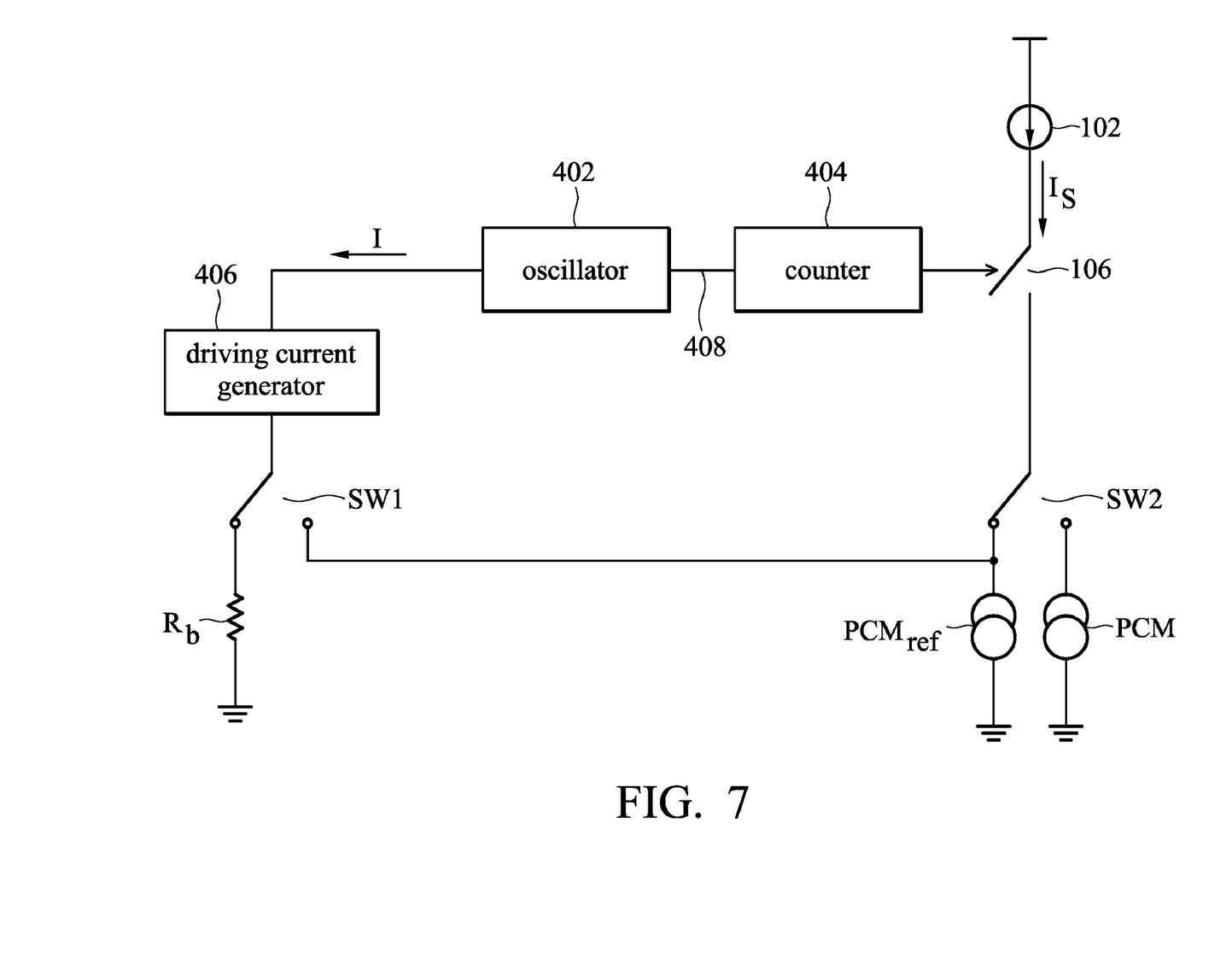
FIG. 7 illustrates an embodiment of the PCM controlling device.

FIG. 7 illustrates an embodiment of the PCM controlling device according to FIGS. 1, 2 and 4 and the corresponding description. A shown in FIG. 7, the first switch $SW_1$ and switch circuit (labeled as second switch $SW_2$) introduced in the description of FIGS. 1 and 2 are shown. The first switch $SW_1$ is introduced by the circuit of FIG. 4 to be combined with the oscillator 402, the counter 404 and the driving current generator 406 to form the conduction period controller 104 introduced in FIGS. 1 and 2. In the first operation mode, the first switch $SW_1$ is coupled to the reference resistor $R_b$ and the second switch $SW_2$ forces the write current $I_S$ to the reference phase change storage element $PCM_{ref}$, and so that the architecture of FIG. 1 is established. In the second operation mode, the first switch $SW_1$ is coupled to the reference phase change storage element $PCM_{ref}$ and the second switch $SW_2$ forces the write current $I_S$ to the controlled phase change storage element PCM, and so that the architecture of FIG. 2 is established. Note that the first and second switches $SW_1$ and $SW_2$ shown in FIG. 7 do not intended to limit the scope of the invention and may be realized in other ways.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded to the broadest interpretation so as to encompass all such modifications and similar arrangements.

What is claimed is:

1. A device controlling a phase change storage element, comprising:

a current source, providing a write current;

a reference phase change storage element, produced next to the phase change storage element;

a reference resistor, having a resistance equal to an ideal set mode resistance of the reference phase change storage element;

a conduction period controller, comprising a first switch for coupling to the reference resistor or the reference phase change storage element, and controlling a conduction period of the write current to be proportional to the reference resistor or the reference phase change storage element to which the first switch is coupled; and a second switch, coupling the write current to the reference phase change storage element or the phase change storage element, wherein the operation of the device comprises a first operation mode and a second operation mode, and wherein:

in the first operation mode, the reference resistor is coupled to the first switch and the second switch forces the write current into the reference phase change storage element, and the conduction period controller controls the conduction period equal to an ideal conduction period of the reference phase change storage element; and in the second operation mode, the reference phase change storage element is coupled to the first switch and the second switch forces the write current into the phase change storage element.

2. The device as claimed in claim 1, wherein the conduction period controller further comprises:

an oscillator, comprising a plurality of inverters that are coupled in series to generate an oscillating signal;

a counter, counting the oscillations of the oscillating signal and setting the conduction period inversely proportional to the counting result; and a driving current generator, generating a driving current for the inverters and making the driving current inversely proportional to the reference resistor or the reference phase change storage element to which the first switch is coupled.

3. The device as claimed in claim 2, wherein the driving current generator comprises:

a transistor, generating the driving current, and coupled in series with the reference resistor or the reference phase change storage element to which the first switch is coupled; and a bias source, coupled to the gate of the transistor.

4. The device as claimed in claim 2, wherein the driving current generator comprises:

a voltage division resistor, coupled in series with the reference resistor or the reference phase change storage element to which the first switch is coupled to generate a divided voltage;

a bias source, providing a voltage drop for the voltage division resistor and the reference resistor or the reference phase change storage element to which the first switch is coupled; and a transistor, generating the write current, and having a gate controlled by the divided voltage.

5. A device controlling a phase change storage element, comprising:
- a current source, providing a write current to be conducted to a reference phase change element in a first mode and to be conducted to the phase change storage element in a second mode;
- the reference phase change storage element, produced next to the phase change storage element;
- a reference resistor, having a resistance equal to an ideal set mode resistance of the reference phase change storage element; and
- a conduction period controller, coupled to the reference resistor or the reference phase change storage element, and controlling a conduction period of the write current to be proportional to the reference resistor or the reference phase change storage element to which the conduction period controller is coupled;

wherein:
- in the first operation mode, the reference resistor is coupled to the conduction period controller and the write current is forced into the reference phase change storage element, and the conduction period controller controls the conduction period equal to an ideal conduction period of the reference phase change storage element; and
- in the second operation mode, the reference phase change storage element is coupled to conduction period controller and the write current is forced into the phase change storage element.

6. The device as claimed in claim 5, wherein the conduction period controller further comprises:
- an oscillator, comprising a plurality of inverters that are coupled in series to generate an oscillating signal;
- a counter, counting the oscillations of the oscillating signal and setting the conduction period inversely proportional to the counting result; and
- a driving current generator, generating a driving current for the inverters and making the driving current inversely proportional to the reference resistor or the reference phase change storage element to which the conduction period controller is coupled.

7. The device as claimed in claim 6, wherein the driving current generator comprises:
- a transistor, generating the driving current, and coupled in series with the reference resistor or the reference phase change storage element to which the conduction period controller is coupled; and
- a bias source, coupled to the gate of the transistor.

8. The device as claimed in claim 6, wherein the driving current generator comprises:
- a voltage division resistor, coupled in series with the reference resistor or the reference phase change storage element to which the conduction period controller is coupled to generate a divided voltage;
- a bias source, providing a voltage drop for the voltage division resistor and the reference resistor or the reference phase change storage element to which the conduction period controller is coupled; and
- a transistor, generating the write current, and having a gate controlled by the divided voltage.

* * * * *